United States Patent [19]

Pirvics et al.

[11] 4,287,226
[45] Sep. 1, 1981

[54] PROCESS FOR PRODUCING COVER COATED ELECTRONIC CIRCUITS

[75] Inventors: Juris Pirvics, Wayne, Pa.; Hargovind N. Vazirani, Stirling, N.J.

[73] Assignee: Bell Telephone Laboratories, Incorporated, Murray Hill, N.J.

[21] Appl. No.: 829,232

[22] Filed: Aug. 31, 1977

Related U.S. Application Data

[63] Continuation of Ser. No. 659,943, Feb. 20, 1976, abandoned.

[51] Int. Cl.$^3$ .................................................. B05D 3/06
[52] U.S. Cl. ................................... 427/54.1; 427/96; 427/282
[58] Field of Search ........................... 427/54, 282, 96

[56] References Cited
U.S. PATENT DOCUMENTS 4,020,191  4/1977  Nagashiro et al. ...................... 427/54
4,049,844  9/1977  Bolon et al. ............................. 427/54

*Primary Examiner*—Bernard D. Pianalto
*Attorney, Agent, or Firm*—Walter G. Nilsen

[57] ABSTRACT

A process is described for producing electronic circuits in which a cover coat is used to protect the circuit elements. The process involves a series of steps including covering the electronic circuit, often before complete fabrication with a substance which cures on exposure to ultraviolet radiation, and exposing at least a portion of the coated electronic circuit to ultraviolet radiation through a silk screen mask. The ultraviolet radiation from a mercury lamp source is concentrated on the cover coat by use of reflection optics rather than conventional lenses. The process includes a procedure for compensating for possible distortion due to use of reflection optics so as to produce the desired pattern on the electronic circuit. The primary advantage of this process lies in the efficient use of ultraviolet radiation for the cure of the cover coating, without sacrifice in the definition and accuracy of the pattern.

10 Claims, 5 Drawing Figures

PROCESS FOR PRODUCING COVER COATED ELECTRONIC CIRCUITS

CROSS REFERENCE TO RELATED APPLICATION

This is a continuation of application Ser. No. 659,943, filed on Feb. 20, 1976, now abandoned, by Juris Pirvics and Hargovind N. Vazirani.

BACKGROUND OF THE INVENTION

1. Field of the Invention

The invention is a process for producing electronic devices in which ultraviolet curable substances are used to produce protective coatings on the devices.

2. Description of the Prior Art

Resins cured by ultraviolet radiation are extensively used in electronics applications. Typical uses are etch resist, plating resist, solder masks and protective coatings. These resists may be used in various stages in the fabrication procedure including at the conclusion of the fabrication procedure to protect the device in use. One particular application of interest is that of a protective coating for flexible printed circuitry. When used in this way as well as in other ways it minimizes the effects of heat, moisture, oxygen, miscellaneous particulate contaminants and mechanical damage to the electronic device. Curable resins are also used in certain soldering applications such as wavesoldering to protect conductors adjacent to that being soldered from the molten solder. This is particularly important in circuits having narrowly spaced, densely packed, conductor geometries which is the current design trend.

Although many polymers are curable in the pure form, it is often desirable to add sensitizers which promote rapid curing in a convenient part of the electromagnetic spectrum. Particularly convenient, especially for some of the newer classes of compounds used as photosensitizers, is the spectral region around 3,000 Angstroms since such sensitized polymer mixtures provide good stability to ambient conditions but provide rapid curing on exposure to curing radiation (see for example, "New Photosensitive Systems for Presensitized Printing Plates" by J. Poot et al., in *J. Photographic Science*, Vol. 19, p. 88 (1971)). Similarly, certain benzoin compounds have greater quantum yields at 313 nm than 366 nm (see "The Photochemistry of Benzoin Ethers" by Ashok Chattopadhyay, University Microfilms, 1974).

From a processing point of view, a rapid, low temperature coating procedure is highly desirable. It prevents damage to heat sensitive parts of electronic devices and is economically compatible with other processing steps in the fabrication of these devices especially where roll-to-roll continuous processing of flexible circuitry is being used. For many applications, patterns of cured resins must be laid down on the electronic circuit. Tolerances in the pattern shape are often quite high, especially in circuits having narrowly spaced, densely packed conductor geometries. It is this combination of rapid and complete curing at room temperature together with the high pattern definition which proves difficult to accomplish under practical manufacturing conditions. Also, the resin should be curable with ultraviolet radiation but relatively stable to visible radiation.

An appreciation of the difficulty in producing satisfactory cover coatings under manufacturing conditions may be obtained by summarizing some obvious requirements of the coatings. The coating should be transparent so as to allow inspection of the covered conductors and other circuit elements. It should be flexible to permit use on flexible substrates. The coating should withstand immersion in molten solder to permit wavesoldering and withstand organic solvents used to remove flux from circuits following the solder operation. It should be flame retardant, have no adverse (e.g., corrosive) effects on circuit elements such as conductors and no adverse effects on the circuit's electrical properties such as resistance, breakdown voltage, losses, semiconductor properties, etc.

Typical procedures presently used involve the use of a mask mounted on pyrex or glass to produce a pattern and the use of pyrex or glass lenses to concentrate the ultraviolet radiation sufficiently to produce curing. Although this procedure is often satisfactory, increasing processing speeds and more rapid curing is often highly desirable. The use of glass or pyrex attenuates the intensity of the ultraviolet radiation especially at the wavelengths most effective in curing many cover coats. This often limits the rate at which coating can be cured and poses problems concerning the dissipation of the heat generated from the absorbed radiation. Although this rate limitation is not disadvantageous under many conditions, where very high speed processing is desired, it may limit processing speed. The use of quartz lenses and mask substrates might permit higher processing speeds but leads to much greater expense and lenses of lower optical quality.

SUMMARY OF THE INVENTION

The invention is a procedure for producing electronic circuits in which an ultraviolet-curable coating is used to protect parts or all of the circuit during or after manufacture. Ultraviolet radiation is directed toward the curable coating by the use of reflection optics generally in the form of a reflecting elliptical surface. A silk screen is used as a mask substrate to exclude radiation from certain portions of the circuit. The process includes a procedure for determining the shape of the mask spots to produce a desired shape on the coated circuit. Use of this procedure results not only in lower cost but also in more rapid curing which permits more rapid production of electronic circuits and continuous production of cover coatings on electronic circuits.

DETAILED DESCRIPTION

The invention is a process for applying cover coats to electronic circuits in which the ultraviolet-curable resin used as the cover coat contains a photosensitizer to promote curing when exposed to ultraviolet light. Radiation is provided by a mercury light (generally a 200 watt/inch medium-pressure mercury lamp) fitted with a reflector to direct the radiation toward the cover coat being photopolymerized. Pattern generation (usually in the form of approximately circular areas) is obtained by use of a silk screen in which certain areas are blocked out by making parts of the silk screen opaque to radiation. A procedure is outlined to compensate for the fact that the curing radiation is not exactly collimated.

Figure 1:
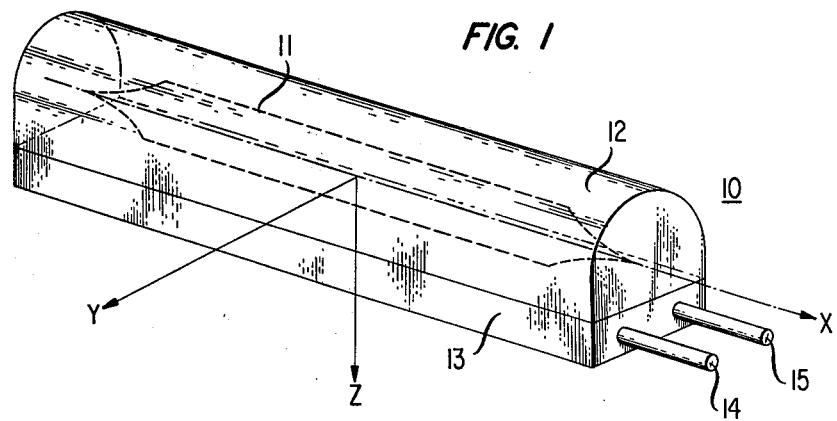
FIG. 1 is a drawing, in prospective, of a mercury ultraviolet source with reflector and water filter.

An understanding of the geometry of the UV lamp setup may be obtained by reference to FIG. 1. The lamp assembly 10 has axial symmetry and is sufficiently long to cover across the circuit substrate (typically 6–18 inches). The UV lamp 11 is equipped with an axial symmetry and concave-shaped in the plane perpendicular to the symmetry axis toward the lamp. Various concave shapes may be used including circular, parabolic, elliptical, etc. It is usually convenient for curing coated circuit boards to have the maximum concentration of radiation about 4–12 inches away from the lamp.

From the point of view of optimum focusing of the radiation from the lamp onto the coated circuit, the reflector should be in the form of an ellipse with the lamp at one focus and the coated circuit at the other focus. For convenience, the ellipse is usually open at one end. The semi-major axis usually has lengths between 1 and 6 inches and the semi-minor axis, shorter than the semi-major axis, between ½ inch and 5 inches. For convenience in positioning lamp and convered circuit, a length of semi-major axis of between 2.5 and 3.5 inches and semi-minor axis of 2.0 and 3.0 inches is preferred.

The lamp assembly may also have a water filter 13 within 14 and out 15 tubes. For greater elimination of infrared radiation, the water used for filtration may contain one or more of the compounds $CoSO_4$, $CuSO_4$ and $NiSO_4$. This arrangement is particularly advantageous for curing coating especially in the middle and higher-energy part of the UV because no lenses or other transmission-type articles are used to focus or concentrate radiation in a particular area. With reflection optics, no absorption takes place. Higher flux densities in the middle and higher-energy part of the UV spectrum insures rapid curing of cover coat and even makes possible continuous curing of cover coats for electronic circuits.

Figure 2:
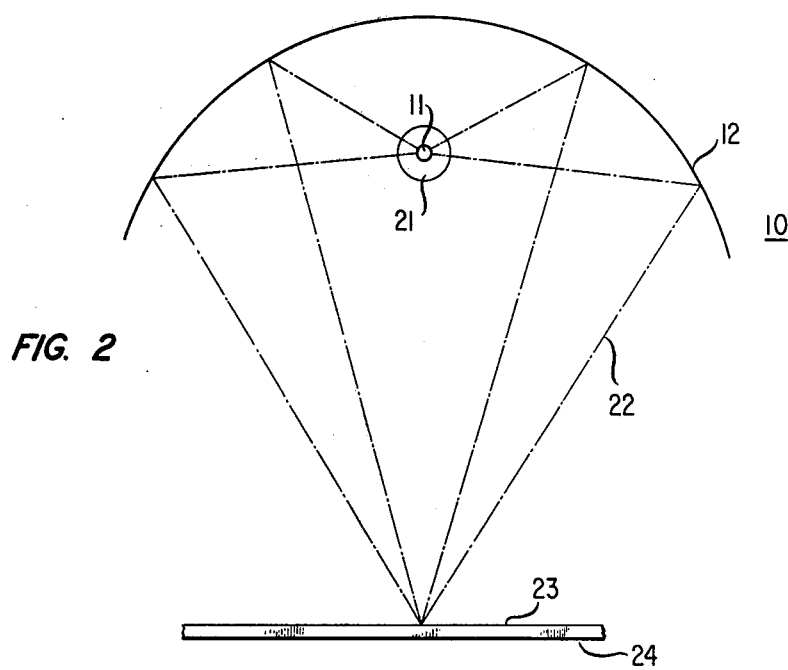
FIG. 2 is a side view of a typical ultraviolet lamp setup showing lamp, reflector, mask and circuit being cover coated.

An end view of the mercury lamp illustrates how the radiation is concentrated to a narrow area by use of a reflector. FIG. 2 shows, in end view, the mercury lamp assmebly 10 with UV lamp 11, including housing 21 and the cylindrical reflector 12. A ray 22 diagram is shown which illustrates how the radiation is concentrated into a particular area at a particular distance away from the reflector. Typically, the screen mask 23 and circuit 24 with curing coating is located at this distance. Although ideally, the focus is a line, in practice it is an area of concentrated radiation because of the finite size of the source and aberations in the optical geometry.

A variety of materials may be used as substrate in masks including glass, pyrex, etc.

In order to insure adequate intensities of shorter wavelength UV radiation on the curable cover coat, the pattern delineation is done with a mask mounted on a silk screen. The silk screen may be made of a variety of materials (silk, nylon, etc.) but generally a metal wire such as steel (especially stainless steel) wire is used. The pattern may be made in various ways, such as, for example, use of paint, etc., to exclude light transmission in certain areas. Methods, including photographic methods, outlined in the book *Screen Printing Electronic Circuits* by Albert Kosloff, The Sign of the Times Publishing Co., Cincinnati, 1968, may be used. Photographic delineation methods, including those described in the above book may also be used.

A particularly convenient system used an emulsion of polyvinyl alcohol and polyvinyl acetate with a diazo sensitizer. The area to be darkened is exposed to light (generally ultraviolet radiation) which leads to photopolymerization including crosslinking. The unexposed part is then washed away usually with water.

Mesh size may vary over large limits but sizes between 230 and 325 are preferred because it gives reasonably fine-grain patterns without undue losses of radiation.

Where rapid curing is desired, such as where a continuous cover-coating procedure is used, it is desirable to concentrate the ultraviolet radiation on a line going across the circuit. In this case, the ultraviolet radiation is not collimated (parallel) and the opaque areas on the mask are not projected unchanged in shape onto the coated circuit board. This distortion in the projection may be corrected for, provided certain parameters are known. Generally, the procedure is applied so as to make the spot size in the direction of the axis of the lamp (X, see FIG. 1) and perpendicular to the axis and parallel to the circuit board (Y in FIG. 1) to specific dimensions.

Although the procedure can be applied under a variety of conditions and geometric parameters, the specific corrections generally only apply to a specific geometry. Parameters of importance are as follows. The greater the distance (Z) between lamp and screen, the less the needed correction. The closer the distance between screen and coating, the less the needed correction. The thicker the emulsion coated screen, the less the needed correction. The thinner the coating and less sensitive the coating the less the needed correction.

Figure 3:
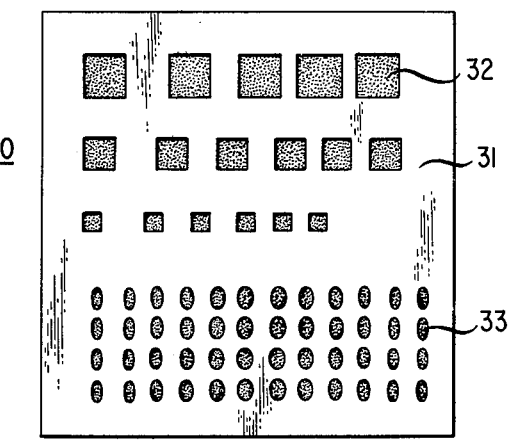
FIG. 3 is a top view of a silk screen mask with various shapes of opaque regions.

The correction may be determined by a procedure using a test mask 30 such as the one shown in FIG. 3. The mask is mounted on a silk screen 31 with opaque rectangular 32 and elliptical 33 areas. Various opaque areas (or spots) differ in dimensions. A test exposure is carried out using the geometric parameters (as described above) and emulsion to be used in cover coating the circuits to be produced. The spot sizes on the developed cover coat are then measured and the mask spot size selected that gives the desired spot size on the circuit.

For example, where a circular spot size with diameter of 1.8 mm is required on the circuit, and the distance between screen mask and circuit surface is about 30 mils, the mask spot size at $Z=16$ cms is $X=2.1$ and $Y=2.6$ mm. For $Z=26$ cms, the mask spot size under the same condition is $X=1.7$ mm and $Y=2.0$ mm.

Figure 4:
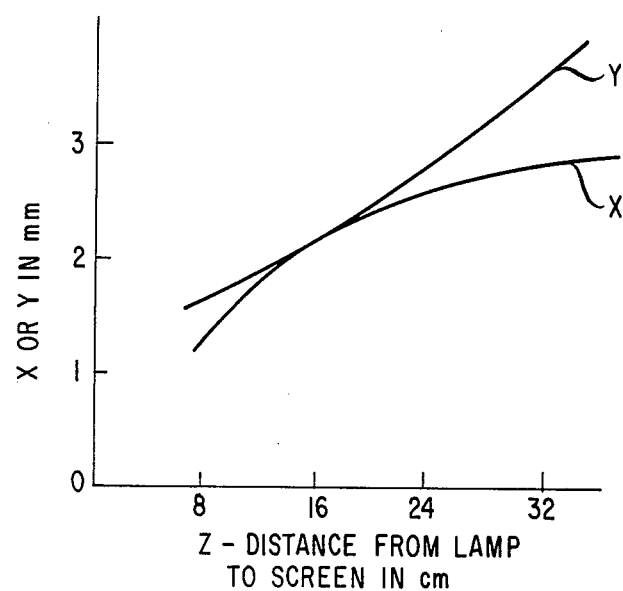
FIG. 4 shows spot shape vs. lamp distance.

FIG. 4 shows the variation of spot size on the circuit surface for a specific size spot ($X=2.4$ mm, $Y=3.1$ mm) on the screen mask. As can be seen, correction is at least for large Z (distances of screen from ultraviolet lamp) but large Z requires long cure times which is inconvenient. These measurements were carried out with a screen thickness of 7 mils and a cover coat thickness at 5–7 mils.

Another example is as follows. For a mask spot size of $X=2.9$ mm, $Y=3.9$ mm, screen thickness of 7 mils and other parameters as above, the spot size on the cover coat is $X=2.2$ mm, $Y=2.9$ mm at $Z=8$ cm and $X=2.6$ mm, $Y=3.3$ mm at $Z=16$ cm. For a 4 mil thickness of masking screen and the same mask spot size, the spot sizes on the cover coat are X=1.8 mm, Y=2.5 mm and X=2.7 mm, Y=3.2 mm respectively for Z=8 and 16 cm.

While good results are obtained using a variety of cover coat compositions, particularly good results, in terms of cure time, reproducibility of spot corrections and properties of cured cover coat are obtained with the following composition based on U.S. Pat. No. 3,813,322.

| Trimellitic anhydride | 6–12% |
|---|---|
| Maleic anhydride | 10–18% |
| Propylene glycol | 15–25% |
| Castor oil | 18–28% |
| Styrene | 25–40% |

The percentages must add up to 100 percent. To this composition is added approximately 0.01 parts per hundred (phr) of 4-tertiary butyl catechol and two phr isobutyl or methyl ether of benzoin.

Figure 5:
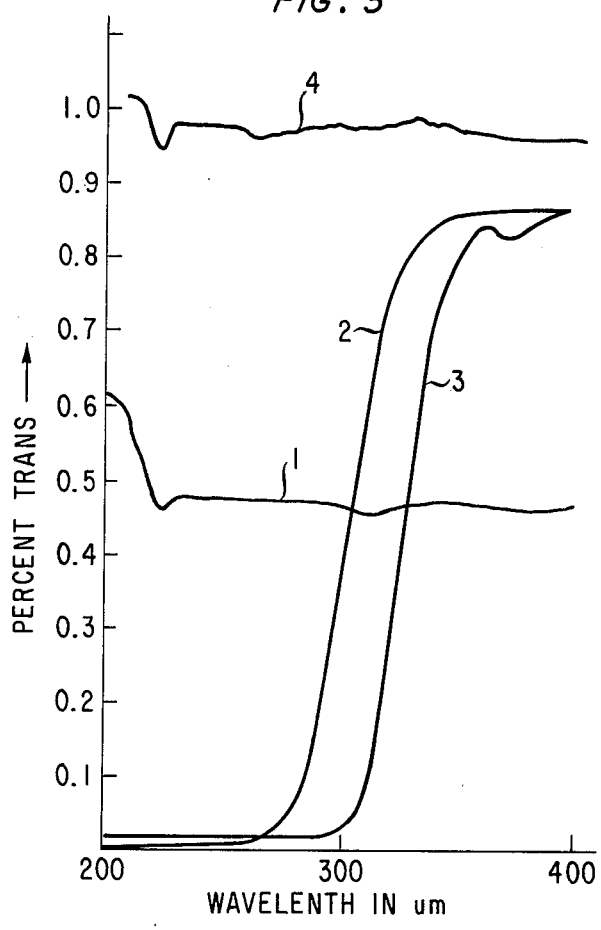
FIG. 5 is a graph on coordinates of percent transmission vs. wavelength showing the light transmission characteristics of silk screen, soda glass and pyrex glass.

The particular advantage of the above composition for the cover coat resin may be understood by examining the transmission properties of various masks as a function of wavelengths. These transmission properties for soda glass, pyrex glass and a silk screen are set forth in FIG. 5. The curve labeled 1 is the silk screen; that labeled 2 is the pyrex glass; and that labeled 3 is the soda glass. The uninterrupted transmission curve is labeled 4. As can be seen from curves 1, 2 and 3, the soda glass and pyrex glass have greater transmission at long wavelengths, but rapidly decrease in transmission below approximately 320 μm for soda glass and 300 μm for pyrex. In the wavelength range below 300 μm where many curable resins are highly sensitive, the silk screen exhibits greater transmission than either pyrex or soda glass. Thus in many instances the use of a silk screen masking substrate leads to much greater transmission of radiation in the spectral region of high sensitivity which leads to more rapid and more complete ultraviolet curing of the cover coat.

Experiments were carried out to show that with the resin composition set forth above a silk screen masking substrated led to more rapid curing than either a pyrex or soda glass substrate with a thickness of 0.125 inches. The resin was 3 mils thick and was considered cured when not tacky to touch and had no vinyl toluene odor. The cure was carried out with a 200 watt per inch medium pressure mercury lamp at a distance of 9 inches with reflector optics as described above. It was found that with the silk screen mask the resin could be cured at a rate of 12 inches per minute whereas with a pyrex substrate curing could only be carried out at 8 inches per minute. With soda glass the corresponding rate was only 4 inches per minute.

What is claimed is:

1. A process for producing electronic circuits in which an ultraviolet curable coating is used to protect parts of the electronic circuit comprising the steps of:
   (a) coating the electronic circuit with ultraviolet curable resin;
   (b) positioning a mask so as to exclude ultraviolet light from certain areas of the electronic circuit coated with ultraviolet curable resin;
   (c) irradiating the curable resin with ultraviolet light using a source of ultraviolet radiation so as to cure at least part of the resin; CHARACTERIZED IN THAT the ultraviolet radiation is directed toward the curable resin and the mask is mounted on a silk screen.

2. The process of claim 1 in which the reflection optics is provided by a reflector in the form of an ellipse.

3. The process of claim 1 in which the semi-major axis of the ellipse is 1–6 inches and the semi-minor axis is shorter than the semi-major axis and between ½ and 5 inches.

4. The process of claim 3 in which the semi-major axis is from 2.5 to 3.5 inches and the semi-minor axis is from 2.0 to 3.0 inches.

5. The process of claim 1 in which the source of ultraviolet radiation is a mercury lamp.

6. The process of claim 1 in which a water jacket is used to filter out infrared radiation.

7. The process of claim 6 in which at least one compound selected from the group consisting of $CoSO_4$, $CuSO_4$ and $NiSO_4$ is dissolved in water contained in the water jacket to filter out infrared radiation.

8. The process of claim 1 in which the silk screen has mesh size between 230 and 325 and the mesh is made of metal wire.

9. The process of claim 8 in which the metal wire consists essentially of steel.

10. The process of claim 1 in which the spot shape on the silk screen mask is different from that on the cover coat so as to compensate for the convergent radiation.

* * * * *